US010367068B2

(12) United States Patent
Athanasiou et al.

(10) Patent No.: US 10,367,068 B2
(45) Date of Patent: Jul. 30, 2019

(54) TRANSISTOR STRUCTURE

(71) Applicant: STMicroelectronics SA, Montrouge (FR)

(72) Inventors: Sotirios Athanasiou, Grenoble (FR); Philippe Galy, Le Touvet (FR)

(73) Assignee: STMicroelectronics SAA, Montrouge (FR)

( * ) Notice: Subject to any disclaimer, the term of this patent is extended or adjusted under 35 U.S.C. 154(b) by 22 days.

(21) Appl. No.: 15/427,656

(22) Filed: Feb. 8, 2017

(65) Prior Publication Data
US 2018/0012965 A1    Jan. 11, 2018

(30) Foreign Application Priority Data

Jul. 5, 2016 (GR) .................................. 160100358
Aug. 5, 2016 (FR) ..................................... 16 57587

(51) Int. Cl.
*H01L 29/36* (2006.01)
*H01L 29/786* (2006.01)

(52) U.S. Cl.
CPC ........ *H01L 29/36* (2013.01); *H01L 29/78603* (2013.01); *H01L 29/78615* (2013.01); *H01L 29/78648* (2013.01)

(58) Field of Classification Search
CPC ............... H01L 29/36; H01L 29/78603; H01L 29/78615; H01L 29/78648
See application file for complete search history.

(56) References Cited

U.S. PATENT DOCUMENTS

| 5,164,805 | A  | * | 11/1992 | Lee     | ...... H01L 27/0605 257/351 |
| 5,573,961 | A  | * | 11/1996 | Hsu     | ...... H01L 29/66772 257/E21.415 |
| 5,637,899 | A  | * | 6/1997  | Eimori  | ...... H01L 27/1203 257/347 |
| 6,387,739 | B1 | * | 5/2002  | Smith, III | ......... H01L 27/1203 257/E27.112 |
| 6,800,910 | B2 | * | 10/2004 | Lin     | ...... H01L 29/1054 257/347 |

(Continued)

FOREIGN PATENT DOCUMENTS

WO    2011162725 A1    12/2011

OTHER PUBLICATIONS

Paydavosi, Navid et al: "BSIM—SPICE Models Enable FinFET and UTB IC Designs," IEEE Access, Digital Object Identifier 10, 1109/Access, 2013.2260816, pp. 201-215.

(Continued)

*Primary Examiner* — Allen L Parker
*Assistant Examiner* — Charles N Ausar-El
(74) *Attorney, Agent, or Firm* — Crowe & Dunlevy

(57) ABSTRACT

A transistor includes a quasi-intrinsic region of a first conductivity type that is covered with an insulated gate. The quasi-intrinsic region extends between two first doped regions of a second conductivity type. A main electrode is provided on each of the two first doped regions. A second doped region of a second conductivity type is position in contact with the quasi-intrinsic region, but is electrically and physically separated by a distance from the two first doped regions. A control electrode is provided on the second doped region.

22 Claims, 4 Drawing Sheets

(56) References Cited

U.S. PATENT DOCUMENTS

| | | | |
|---|---|---|---|
| 7,084,462 B1* | 8/2006 | Warnock | H01L 27/088 257/348 |
| 7,902,014 B2* | 3/2011 | Doyle | H01L 21/82380 438/197 |
| 8,436,356 B2* | 5/2013 | Lee | H01L 27/12 257/59 |
| 8,829,620 B2* | 9/2014 | Galy | H01L 21/823431 257/333 |
| 9,660,034 B1* | 5/2017 | Galy | H01L 21/84 |
| 9,716,136 B1* | 7/2017 | Abou-Khalil | H01L 28/20 |
| 9,837,413 B2* | 12/2017 | Galy | H01L 21/84 |
| 10,096,708 B2* | 10/2018 | Athanasiou | H01L 29/7838 |
| 2002/0027246 A1* | 3/2002 | Kunikiyo | H01L 29/783 257/347 |
| 2002/0109138 A1 | 8/2002 | Forbes | |
| 2003/0155615 A1* | 8/2003 | Yoshida | H01L 21/84 257/350 |
| 2004/0026736 A1 | 2/2004 | Grupp et al. | |
| 2004/0036118 A1* | 2/2004 | Abadeer | H01L 29/786 257/347 |
| 2005/0176186 A1* | 8/2005 | Lee | H01L 29/42384 438/157 |
| 2005/0184341 A1* | 8/2005 | Wei | H01L 29/78603 257/347 |
| 2008/0067587 A1* | 3/2008 | Gossner | H01L 21/84 257/336 |
| 2008/0290413 A1* | 11/2008 | Mandelman | H01L 29/78615 257/347 |
| 2009/0283832 A1* | 11/2009 | Sugiura | H01L 27/0248 257/355 |
| 2011/0031552 A1* | 2/2011 | Iwamatsu | H01L 21/845 257/347 |
| 2011/0147838 A1 | 6/2011 | Gossner et al. | |
| 2012/0205744 A1* | 8/2012 | O | H01L 21/266 257/352 |
| 2012/0248542 A1* | 10/2012 | Galy | H01L 21/82343 257/368 |
| 2013/0026471 A1* | 1/2013 | Zahurak | H01L 21/84 257/57 |
| 2013/0141824 A1* | 6/2013 | Bourgeat | H01L 23/60 361/56 |
| 2013/0334570 A1* | 12/2013 | Lin | H01L 29/36 257/191 |
| 2014/0035040 A1* | 2/2014 | Le Royer | H01L 29/7831 257/365 |
| 2014/0203364 A1* | 7/2014 | Tsunomura | H01L 29/66742 257/347 |
| 2014/0346601 A1* | 11/2014 | Sugiura | H01L 29/78 257/347 |
| 2015/0077888 A1 | 3/2015 | Galy et al. | |
| 2015/0270400 A1* | 9/2015 | Singh | H01L 29/7851 257/402 |
| 2015/0340294 A1* | 11/2015 | Divakaruni | H01L 21/845 257/347 |
| 2016/0079277 A1* | 3/2016 | Hook | H01L 21/823807 257/348 |
| 2017/0033127 A1* | 2/2017 | Zhao | H01L 29/78648 |
| 2017/0179156 A1* | 6/2017 | Ellis-Monaghan | H01L 27/1203 |
| 2017/0288059 A1* | 10/2017 | Athanasiou | H01L 29/7838 |

OTHER PUBLICATIONS

INPI Search Report and Written Opinion for FR 1657587 dated Mar. 8, 2018 (6 pages).

* cited by examiner

TRANSISTOR STRUCTURE

PRIORITY CLAIM

This application claims the priority benefit of French Application for Patent No. 1657587, filed on Aug. 5, 2016, and the priority benefit of Greece Application for Patent No. 20160100358, filed on Jul. 5, 2016, the disclosures of which are hereby incorporated by reference in their entirety.

TECHNICAL FIELD

The present disclosure relates to the field of electronic components, and in particular to a transistor structure.

BACKGROUND

An N-channel MOS transistor comprises a drain region and a source region, both N-type doped, separated by a channel region covered with an insulated gate. Main electrodes are located on the drain and source regions. A positive voltage is applied between the drain and the source through the main electrodes. The flowing of a current through the transistor between the main electrodes is then controlled by a gate voltage, or control voltage, applied between the gate and the source. An advantage of the MOS transistor is that the control current which flows to the gate is close to zero.

When the control voltage is greater than a threshold voltage, the transistor is in a conductive state and a current flows through the transistor between the main electrodes.

When the control voltage is decreased from the conductive state, the MOS transistor switches to the off state as soon as the control voltage becomes lower than the threshold voltage. As long as the difference between the control voltage and the threshold voltage is smaller than a few hundreds of millivolts, there remains a leakage current, the transistor then being in a lightly blocked state. The intensity of the leakage current decreases as the control voltage decreases, in a way which depends on temperature. The variation of the leakage current according to the control voltage is characterized by a subthreshold swing value defined by the decrease of the control voltage, which causes a division by 10 of the intensity of the leakage current. At an ambient temperature close to 20° C., a MOS transistor has a subthreshold swing value greater than 60 mV/decade.

Due to the high subthreshold swing value, in order for the leakage current to disappear, the control voltage should be much lower than the threshold voltage, for example, distant by more than 500 mV from the threshold voltage. The transistor is then strongly blocked and no significant current flows through the transistor.

Similarly to the MOS transistor, a bipolar transistor comprises two N-type doped regions, in contact with main electrodes. The emitter and collector regions are separated by a base region. A positive voltage is applied between the collector and the emitter.

The bipolar transistor is in the on state when a control current is conducted from the base region to the emitter region. To achieve this, a control voltage greater than a threshold voltage is applied between the base and the emitter. The control current corresponds to the circulation of holes through the transistor. The presence of such holes enables a main current to flow between the main electrodes. The bipolar transistor then has a gain defined by the ratio of the main current to the control current. An advantage of the bipolar transistor is that it enables a particularly high main current to flow.

The control voltage is decreased to block the bipolar transistor. There remains a leakage current similar to that of the MOS transistor between the main electrodes of the bipolar transistor as long as the control voltage is close to the threshold voltage. In the same way as in the MOS transistor, the control voltage should be much lower than the threshold voltage so that the bipolar transistor is strongly blocked and that no significant current flows through the transistor.

There is a need for a transistor enabling to combine some of the advantages of MOS transistors and of bipolar transistors and to overcome all or part of their disadvantages.

SUMMARY

Thus, an embodiment provides a transistor comprising: a quasi-intrinsic region of a first conductivity type covered with an insulated gate and extending between two first doped regions of a second conductivity type, a main electrode being arranged on each of the first regions; and a second doped region of the second conductivity type in contact with the quasi-intrinsic region and at a distance (physically and electrically separate) from the first two regions, a control electrode being arranged on the second region.

According to an embodiment, the transistor is arranged on the insulator of a SOI structure.

According to an embodiment, the quasi-intrinsic region is strip-shaped, the second doped region comprising two electrically-connected portions arranged on either side of a portion of the quasi-intrinsic region.

According to an embodiment, the quasi-intrinsic region has the shape of a fork comprising a portion of connection between a handle and two branches, a portion of the handle extending between the first two regions, the second region extending between the two branches, the second region being in contact with the two branches and with the connection portion.

According to an embodiment, the insulator is arranged on a semiconductor substrate of the second conductivity type provided with a bias contact.

According to an embodiment, the insulator has a thickness smaller than 30 nm.

According to an embodiment, the second region is physically separated from the first regions by a distance shorter than 500 nm.

According to an embodiment, the thickness of the quasi-intrinsic region is smaller than 20 nm.

An embodiment provides an electronic circuit comprising a transistor such as previously defined and a circuit for controlling the transistor, wherein the first conductivity type is type N and the control circuit is capable of applying between each of the main electrodes and the gate a voltage greater than 0.5 V and between the control electrode and the gate a voltage greater than 1 V.

An embodiment provides a transistor such as previously defined and a circuit for controlling the transistor, wherein the first conductivity type is type P and the control circuit is capable of applying between the gate and each of the main electrodes a voltage greater than 0.5 V and between the gate and the control electrode a voltage greater than 1 V.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
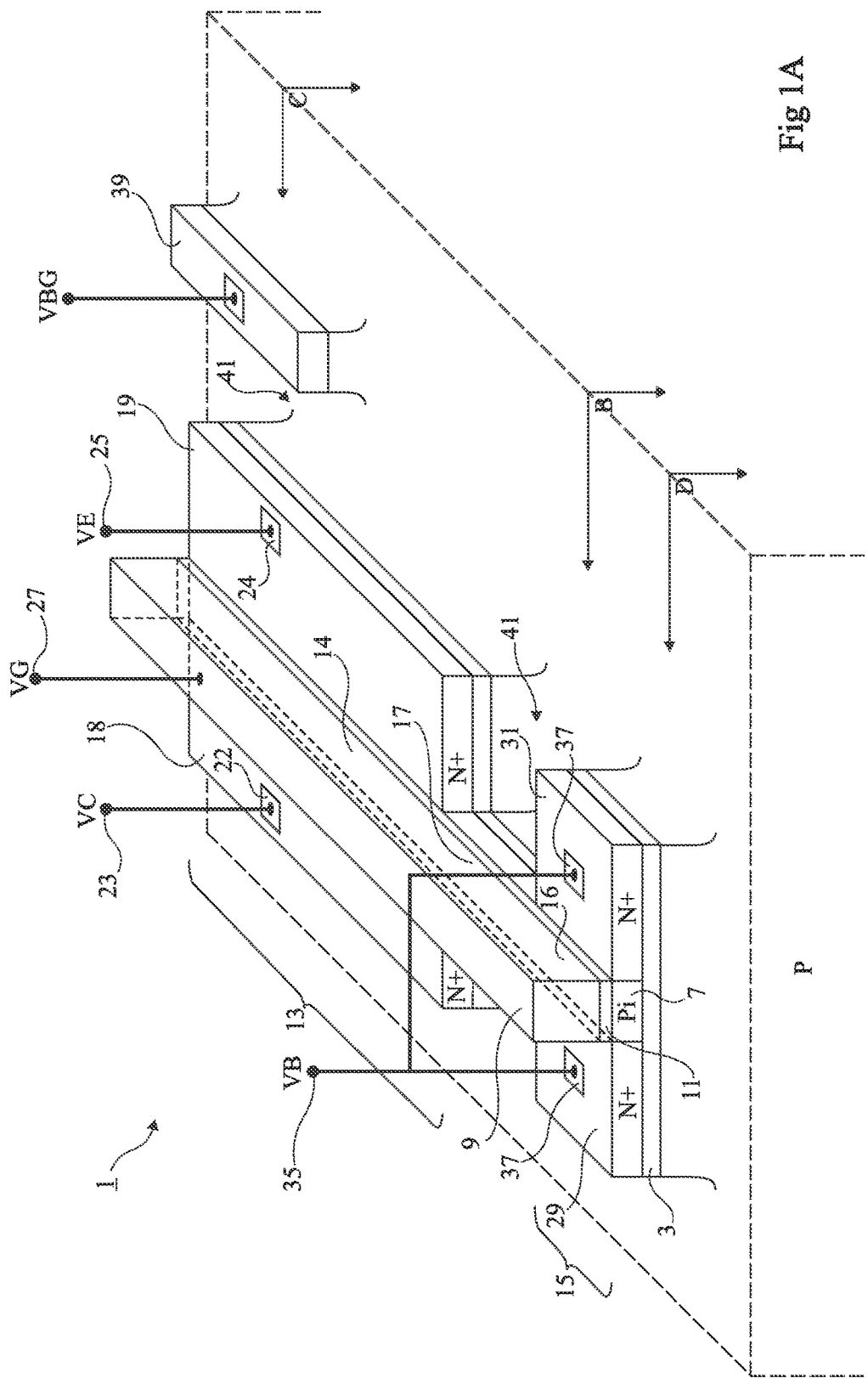
FIGS. 1A to 1D are simplified views illustrating an embodiment of a transistor.

For clarity, the same elements have been designated with the same reference numerals in the various drawings and, further, the various drawings are not to scale. For clarity, only those steps and elements which are useful to the understanding of the described embodiments have been shown and are detailed.

In the following description, unless otherwise specified, when reference is made to terms qualifying a relative position, such as term "above" and "under", reference is made to the orientation of the concerned element in the cross-section views. Unless otherwise specified, expression "in the order of" means to within 10%, preferably to within 5%.

In the present disclosure, expression "quasi-intrinsic" designates an intrinsic semiconductor (non-doped) or a semiconductor having a doping level lower than $10^{15}$ atoms/cm$^3$. A quasi-intrinsic semiconductor may thus be slightly N-type or P-type doped. Further, "heavily-doped" qualifies a semiconductor having a doping level greater than $5*10^{18}$ atoms/cm$^3$.

FIGS. 1A to 1D illustrate an embodiment of a transistor 1. FIG. 1A is a simplified perspective view where the insulating material of insulating trenches is not shown. Views 1B to 1D correspond to cross-section views along respective planes B, C, and D shown in FIG. 1A.

Transistor 1 is located on a portion of an insulating layer 3 of a structure of semiconductor-on-insulator type, SOI, for example, silicon on insulator. In the SOI structure, insulating layer 3 covers a P-type doped semiconductor substrate 5, for example, silicon.

Figure 1B:
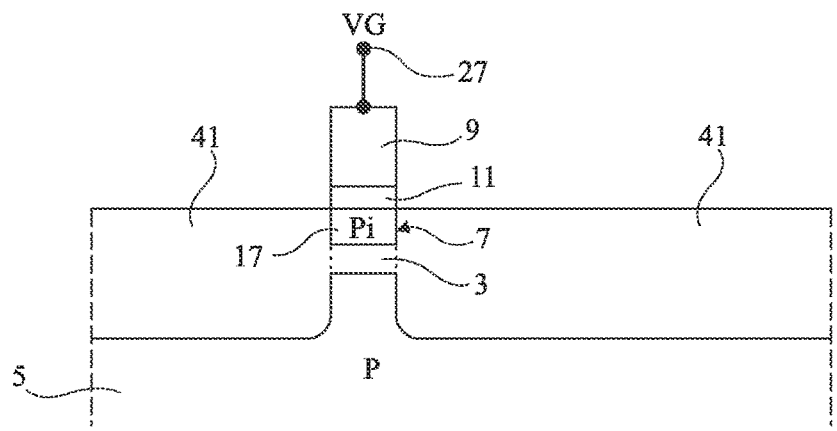

Transistor 1 comprises a strip-shaped region 7 made of P-type quasi-intrinsic semiconductor (Pi). Quasi-intrinsic strip 7 is entirely covered with a gate 9 insulated by an insulator 11 located between the gate and the strip. Transistor 1 comprises a conduction structure 13 in association with a portion 14 of strip 7 and a control structure 15 in association with a portion 16 of strip 7. A portion 17 of strip 7, shown in FIG. 1B, is located between portions 14 and 16 and interconnects conduction and control structures 13 and 15.

Figure 1C:
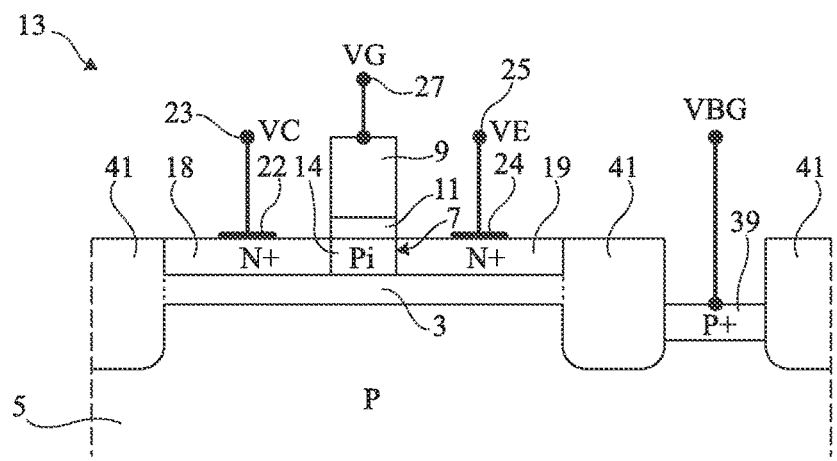

Conduction structure 13, shown in FIG. 1C, corresponds to the structure of a MOS transistor. Conduction structure 13 comprises heavily N-type doped regions 18 and 19 arranged opposite each other on either side of portion 14 of strip 7 and in contact with the large sides of strip 7. Region 18 corresponds to a drain region and region 19 corresponds to a source region. A main electrode 22 connected to a node 23 of application of a potential VC is in contact with N+ region 18. A main electrode 24 connected to a node 25 of application of a potential VE is in contact with N+ region 19. Gate 9 is connected to a node 27 of application of a potential VG.

Figure 1D:
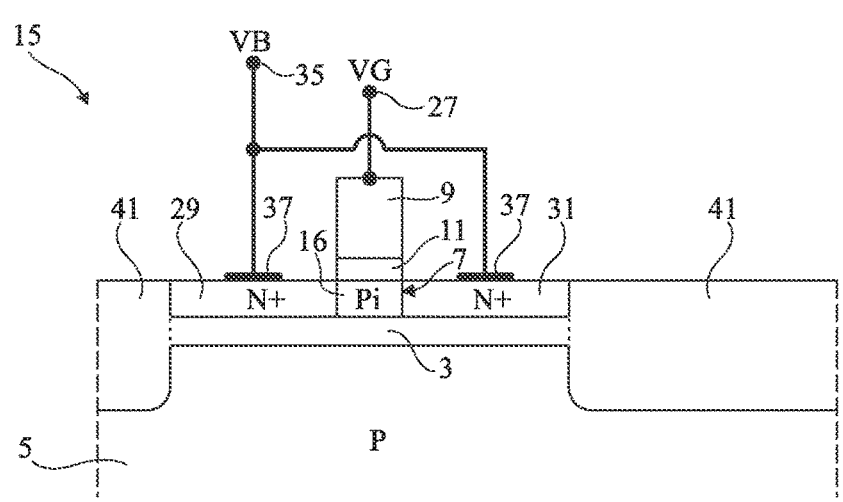

Control structure 15, shown in FIG. 1D, comprises heavily N-type doped N+ regions 29 and 31, physically and electrically separate from N+ regions 18 and 19, arranged opposite each other on either side of portion 16 of strip 7 and in contact, for example, by abrupt junctions with the large sides of strip 7. Regions 29 and 31 are connected together to a node 35 of application of a potential VB via electrodes 37.

Each of electrodes 22, 24, and 37 associated with one of N+ regions 18, 19, 29, and 31 may be a conductive layer portion partly or totally covering the N+ region or may be a conductive via arranged on the N+ region. An N+-type doped epitaxial semiconductor portion, not shown, may cover each of N+ regions 18, 19, 29, and 31, and the associated electrode then covers the epitaxial portion. Substrate 5 is connected by a contact area 39 to a node of application of a bias potential VBG. Insulating trenches 41 delimit and insulate transistor 1 and contact area 39.

Transistor 1 is used according to an operating mode different from that of a MOS transistor. In this operating mode, the MOS transistor corresponding to conduction structure 13 is strongly blocked by a gate voltage distant, for example, by more than 0.5 V, from the threshold voltage of the MOS transistor. A positive voltage VC−VE is applied between drain and source regions 18 and 19, and the gate voltage then corresponds to voltage VG−VE between the gate and source region 19.

Although the MOS transistor is strongly blocked, control structure 15 enables to control the flowing of a main current between the main electrodes of conduction structure 13. To achieve this, a voltage VB−VG is applied between, on the one hand, N+ regions 29 and 31 and, on the other hand, gate 9.

The main current flows when voltage VB−VG is positive and exceeds a tunnel effect threshold voltage which may be greater than 1 V, for example, in the order of 1.5 V.

Indeed, in this case, valence electrons of region 7, located close to one of N+ regions 29 and 31, leave region 7 by tunnel effect and become conduction electrons in N+ regions 29 or 31. The leaving of these electrons corresponds to the appearing of holes in region 7. A tunnel current which flows from N+ regions 29 and 31 to region 7 is thus obtained. The tunnel current is favored by the abruptness of the junctions between region 7 and N+ regions 29 and 31.

Due to the quasi-intrinsic character of region 7, the holes originating from the tunnel current may propagate along a significant distance without disappearing by recombination. Thus, the holes originating from the tunnel current propagate in portion 14 of region 7 located in conduction structure 13. The distance between portions 14 and 16 of region 7, or width of portion 17 (in the gate width direction) may be limited, for example, to a value smaller than 500 nm. This enables to ease the propagation of holes in portion 14 of region 7. Further, due to the strip shape of region 7, the holes are channeled and may simply access the entire region 7. Here again, this enables to ease the propagation of holes in portion 14 of region 7.

In conduction structure 13, quasi-intrinsic portion 14 located above biased gate 9 has a function similar to that of a base region of a bipolar transistor. The bipolar transistor comprises region 19, which forms an emitter region, and region 18, which forms a collector region. Due to the high value of the tunnel effect threshold voltage, voltage VB, greater than voltage VE, is sufficient for the holes originating from the tunnel current to have an energy level which enables them to penetrate into emitter region 19. A control current then flows through the bipolar transistor. Accordingly, a main current flows in the bipolar transistor between collector region 18 and emitter region 19.

A property of control structure 15 is that, when control voltage VB–VG decreases from the tunnel effect threshold voltage, the tunnel current particularly rapidly becomes negligible. Further, the ratio of the tunnel current to the main current corresponds to the gain of the bipolar transistor. The tunnel current is thus amplified by the transistor.

Thus, according to an advantage, the main current in transistor 1 is particularly high and decreases particularly rapidly when control voltage VB–VG decreases from the tunnel effect threshold voltage. When control voltage VB–VG is smaller than the tunnel effect threshold voltage, the subthreshold swing value, defined by the decrease of the control voltage which causes a division by 10 of the intensity of the main current, is smaller than 60 mV/decade.

Figure 2:
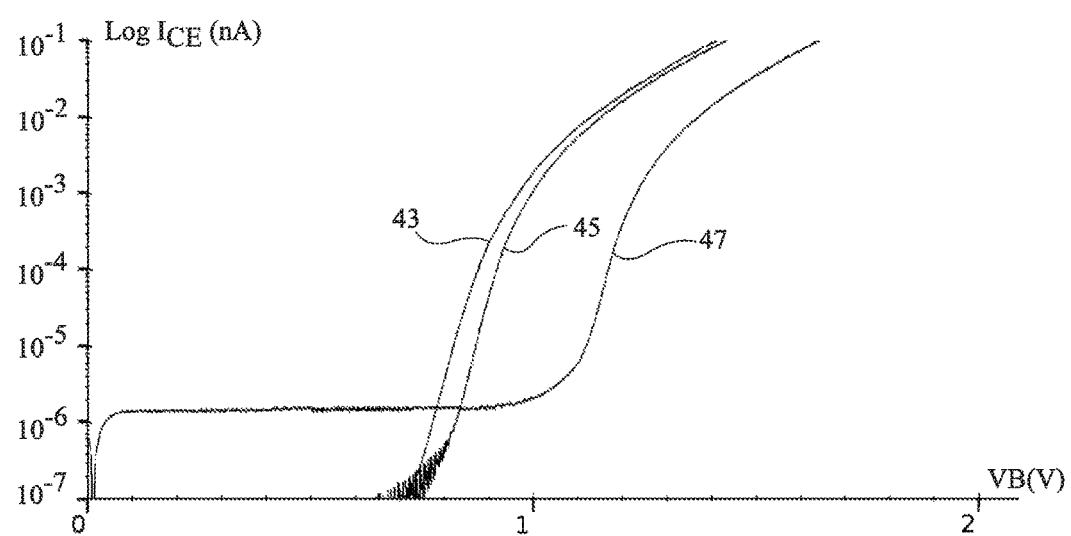
FIG. 2 shows the variation of a current according to a voltage in a transistor according to the embodiment of FIGS. 1A to 1D.

FIG. 2 shows examples of curves of the variation of main current $I_{CE}$ according to potential VB in a transistor of the type of transistor 1 of FIGS. 1A to 1D. These curves have been obtained by digital simulation. Curves 43, 45, and 47 correspond to fixed negative values respectively equal to −0.9 V, −0.8 V, and −0.5 V of gate potential VG. Potentials VE and VBG are zero and a positive 100-mV voltage is applied between the collector region and the emitter region.

The fixed values of potential VG used in the examples of FIG. 2 guarantee that the MOS transistor is strongly blocked. The subthreshold swing values are approximately 40 mV.

In the example of FIGS. 1A to 1D, substrate 5 provided with contact area 39 may form a rear gate associated with transistor 1. The values of the MOS transistor threshold or tunnel effect threshold voltages may be controlled by the application to the rear gate of a selected value of potential VBG. Such a control is made easier when the thickness of insulating layer 3 is small, for example, smaller than 30 nm.

As an example, N+ regions 29 and 31 are doped to a level greater than $10^{20}$ atoms/cm$^3$. As an example, region 7 has a thickness smaller than 20 nm, which corresponds to a FDSOI-type structure. The distance separating regions 18 and 19, or gate length, may be in the range from 20 to 40 nm. The width of portion 14 may be in the range from 0.5 to 2 μm. The width of portion 16 may be in the range from 200 to 400 nm. Insulated gate 9 may extend on regions 18 and 19 along a distance smaller than 5 nm.

It should be noted that, in the embodiment of transistor 1, regions 18 and 19 may be arranged symmetrically with respect to quasi-intrinsic region 7. Thus, although, in the described embodiment, voltage VC–VE is positive, other operating modes are possible, where voltage VC–VE is negative, region 18 corresponding to a source or emitter region, and region 19 corresponding to a drain or collector region.

Although operating modes where the MOS transistor of conduction structure 13 is in the strongly blocked state have been described, other operating modes are possible where the MOS transistor is in the conductive state or in the lightly blocked state. The operation of the MOS transistor controlled by gate voltage VG–VE can then be associated with the operation of the bipolar transistor of conduction structure 13. For this purpose, a control voltage VB–VG enabling to inject holes into conduction structure 13 while applying a voltage VG–VE allowing by itself the flowing of a main current between the main electrodes may be applied.

Figure 3:
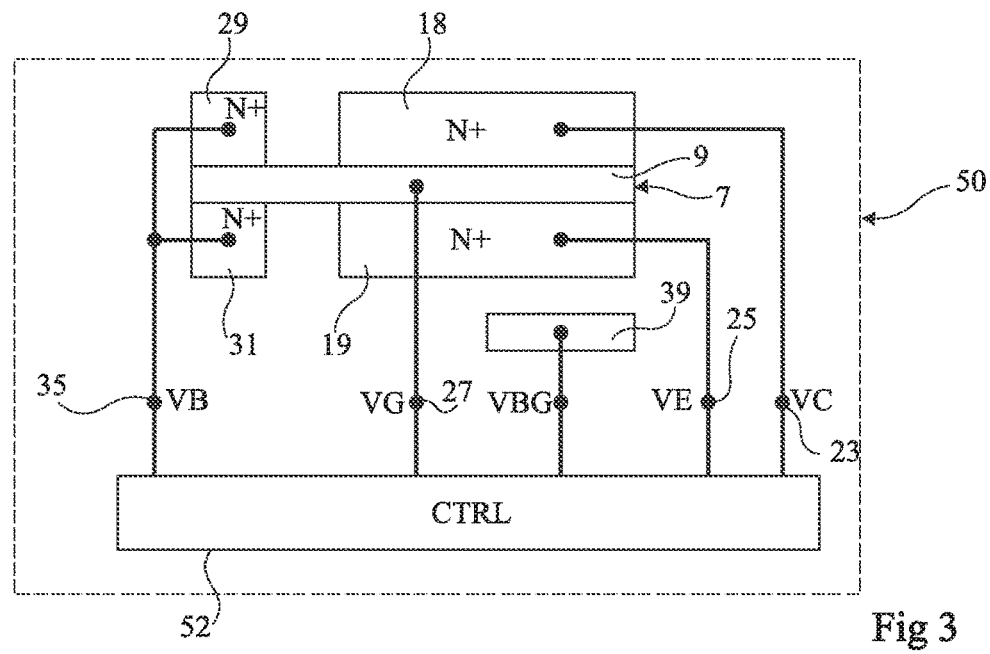
FIG. 3 shows an electronic circuit comprising a transistor according to the embodiment of FIGS. 1A to 1D.

FIG. 3 shows an electronic circuit 50 comprising transistor 1 described in relation with FIGS. 1A to 1D. Transistor 1 is schematically illustrated in top view at a different scale. The elements of electronic circuit 50 other than transistor 1 are represented by a short-circuit 52 (CTRL). Sub-circuit 52 may comprise transistors similar to transistor 1.

When circuit 50 is operating, sub-circuit 52 respectively applies potentials VC, VE, VB and VG to respective nodes 23, 25, 35, and 27 of transistor 1, as well as a potential VBG to rear gate contact area 39, these potentials corresponding to the operating modes described in relation with FIGS. 1A to 1D. Sub-circuit 52 thus plays the role of a circuit for controlling transistor 1.

Although the embodiment of transistor 1 described in relation with FIGS. 1A to 1D comprises two N+ regions 29 and 31 arranged on either side of quasi-intrinsic region 7, other embodiments are possible where one of N+ regions 29 or 31 is omitted.

Figure 4:
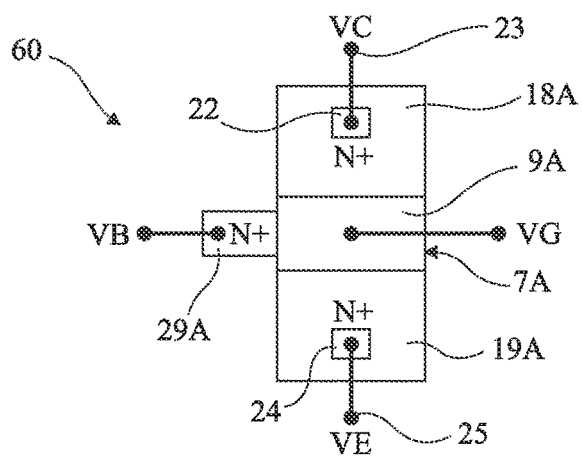
FIG. 4 is a simplified cross-section view illustrating another embodiment of a transistor.

FIG. 4 is a simplified top view of an embodiment of a transistor 60 where a control structure comprises a single N+ region. An insulated gate 9A entirely covers a quasi-intrinsic P-type region 7A having a rectangular shape in top view. N+ regions 18A and 19A, heavily N-type doped, are arranged on either side of the large sides of the rectangle and in contact with region 7A. Regions 18A and 19A are connected by main electrodes 22 and 24 to nodes 23 and 25 of application of potentials VC and VE. An N+ region 29A physically and electrically separate from regions 18A and 19A is in contact with one of the small sides of region 7A. Although no rear gate contact area is shown in FIG. 4, transistor 60 may be associated with a rear gate.

Although the previously-described embodiments comprise a quasi-intrinsic region having a specific shape, the quasi-intrinsic region may have any other shape comprising a first portion associated with a MOS transistor structure and a second portion in contact with a heavily N-type doped region, this shape being adapted to the circulation of holes between the first portion and the second portion.

Figure 5:
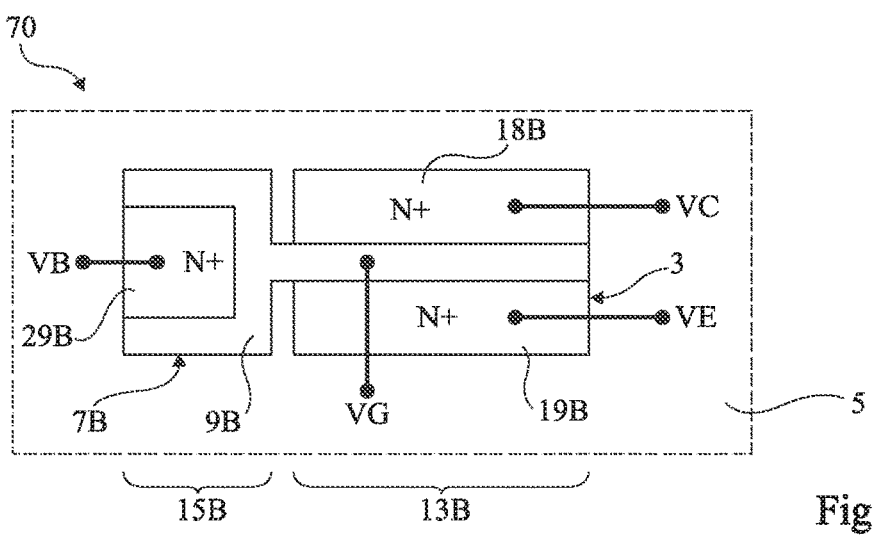
FIG. 5 is a simplified top view illustrating another embodiment of a transistor.

FIG. 5 is a simplified top view of an embodiment of a transistor 70. Transistor 70 comprises a quasi-intrinsic region 7B entirely covered with an insulated gate 9B. Quasi-intrinsic region 7B has in top view the shape of a fork with two branches, that is, it comprises a handle which extends in a strip along an axis, the strip being continued, on either side at one end and orthogonally to this axis, by portions of connection to branches of rectangular shape. The branches extend parallel to the axis away from the handle. Transistor 70 comprises a conduction structure 13B associated with a portion of the handle and comprising two heavily N-type doped N+ regions 18B and 19B. Regions 18B and 19B are arranged on either side of the handle and separated from the connection portions. Transistor 70 further comprises a control structure comprising a heavily-doped N-type region 29B arranged between the branches, in contact therewith and with the connection portion. The junctions between region 29B and region 7B are for example abrupt. Transistor 70 is arranged on the surface of an insulating layer 3 covering a support 5.

In operation, potentials VC, VE, VB, and VG are respectively applied to regions 18B, 19B, 29B, and on gate 9B, according to the above-described embodiments.

The configuration of control structure 15B enables, for a given tunnel current intensity supplied by the control structure, to limit the capacitances of stray capacitive elements formed, on the one hand, between quasi-intrinsic region 7B and gate 9B through insulator 11 and, on the other hand, between quasi-intrinsic region 7B and support 5 through insulating layer 3. Thereby, control structure 15B provides a fast transistor capable of operating at high frequencies.

Specific embodiments have been described. Various alterations, modifications, and improvements will occur to those skilled in the art. In particular, although the described embodiments comprise a single control structure, other embodiments are possible where a quasi-intrinsic region comprises a central portion and two end portions, the central portion being comprised in a conduction structure and each of the end portions being comprised in a control structure. The two control structures can then be arranged symmetrically on either side of the conduction structure. The heavily-doped N-type regions of the two control structures may be connected to a same node of application of a potential VB.

Although, in the described embodiments, the transistor is associated with a rear gate, other embodiments are possible where the transistor is not associated with a rear gate.

In the described embodiments, transistor 1 comprises a conduction structure corresponding to a MOS transistor. The MOS transistor may also comprise LDD-type (lightly-doped drain) regions.

Although the described embodiments comprise heavily N-type doped regions in contact with a quasi-intrinsic P-type region arranged under a gate, the N and P conductivity type may be exchanged. One thus obtains an embodiment of a transistor comprising: first heavily P-type doped regions arranged on either side of a quasi-intrinsic N-type region and in contact therewith; and at least one second heavily P-type doped region in contact with the quasi-intrinsic region. The operating modes are similar to the described operating modes where the applied voltages are replaced with voltages of opposite signs.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A transistor, comprising:
   a quasi-intrinsic region of a first conductivity type and including a first portion and a second portion that are both covered with a same insulated gate;
   two first doped regions of a second conductivity type in contact with the first portion of the quasi-intrinsic region, where the first portion of the quasi-intrinsic region extends between the two first doped regions;
   a main electrode arranged on each one of the two first doped regions;
   a second doped region of the second conductivity type in contact with the second portion of the quasi-intrinsic region but physically separated from each one of the two first doped regions, and
   a control electrode arranged on the second doped region;
   wherein the second doped region is configured, in response to a bias applied to the control electrode, to supply charge into the quasi-intrinsic region to operate the transistor as a bipolar transistor device with the two first doped regions forming emitter and collector terminals of the bipolar transistor device and the quasi-intrinsic region forming a base terminal of the bipolar transistor device.

2. The transistor of claim 1, arranged on an insulator layer of a semiconductor on insulator (SOI) structure.

3. The transistor of claim 2, wherein the insulator layer is arranged on a semiconductor substrate of the second conductivity type provided with a bias contact.

4. The transistor of claim 3, wherein the insulator layer has a thickness smaller than 30 nm.

5. The transistor of claim 1, wherein the quasi-intrinsic region is strip-shaped including a pair of opposed sides each in contact with one of the two first doped regions, and wherein the second doped region comprises two electrically-connected portions in contact with the pair of opposed sides of the quasi-intrinsic region.

6. The transistor of claim 1, wherein the quasi-intrinsic region is strip-shaped including a pair of opposed sides each in contact with one of the two first doped regions at the first portion, and wherein the second doped region is in contact with a further side of the quasi-intrinsic region at the second portion.

7. The transistor of claim 1, wherein the quasi-intrinsic region has the shape of a fork comprising:
   a handle;
   two branches; and
   a connection between the handle and the two branches;
   wherein a portion of the handle extends between the two first doped regions at the first portion; and
   wherein the second doped region extends between the two branches at the second portion with the second doped region being in contact with each of the two branches and with the connection.

8. The transistor of claim 1, wherein a physical separation distance between the second doped region and at least one of the two first doped regions along an edge of the quasi-intrinsic region is smaller than 500 nm.

9. The transistor of claim 1, wherein a thickness of the quasi-intrinsic region is smaller than 20 nm.

10. The transistor of claim 1, wherein the injected charge is holes.

11. An electronic circuit, comprising:
   a transistor, comprising:
      a quasi-intrinsic region of a first conductivity type and including a first portion and a second portion that are both covered with a same insulated gate;
      two first doped regions of a second conductivity type in contact with the first portion of the quasi-intrinsic region, where the first portion of the quasi-intrinsic region extends between the two first doped regions;
      a main electrode arranged on each one of the two first doped regions;
      a second doped region of the second conductivity type in contact with the second portion of the quasi-intrinsic region but physically separated from each one of the two first doped regions, and
      a control electrode arranged on the second doped region;
      wherein the first conductivity type is type N; and
   a circuit for controlling the transistor, said circuit configured to apply a voltage greater than 0.5 V between each of the main electrodes and the insulated gate and apply a voltage greater than 1 V between the control electrode and the insulated gate.

12. The electronic circuit of claim 11, wherein the second doped region is configured, in response to the voltage greater than 1 V between the insulated gate and the control electrode, to supply charge into the quasi-intrinsic region to operate the transistor as a bipolar transistor device with the two first doped regions forming emitter and collector terminals of the bipolar transistor device and the quasi-intrinsic region forming a base terminal of the bipolar transistor device.

13. An electronic circuit, comprising:
   a transistor, comprising:
      a quasi-intrinsic region of a first conductivity type and including a first portion and a second portion that are both covered with a same insulated gate;
      two first doped regions of a second conductivity type in contact with the first portion of the quasi-intrinsic region, where the first portion of the quasi-intrinsic region extends between the two first doped regions;

a main electrode arranged on each one of the two first doped regions;

a second doped region of the second conductivity type in contact with the second portion of the quasi-intrinsic region but physically separated from each one of the two first doped regions, and a control electrode arranged on the second doped region;

wherein the first conductivity type is type P; and a circuit for controlling the transistor, said circuit configured to apply a voltage greater than 0.5 V between the insulated gate and each of the main electrodes and apply a voltage greater than 1 V between the insulated gate and the control electrode.

14. The electronic circuit of claim 13, wherein the second doped region is configured, in response to the voltage greater than 1 V between the insulated gate and the control electrode, to supply charge into the quasi-intrinsic region to operate the transistor as a bipolar transistor device with the two first doped regions forming emitter and collector terminals of the bipolar transistor device and the quasi-intrinsic region forming a base terminal of the bipolar transistor device.

15. A transistor, comprising:

a quasi-intrinsic region of a first conductivity type covered with an insulated gate;

two first doped regions of a second conductivity type in contact with the quasi-intrinsic region with the quasi-intrinsic region extending between the two first doped regions;

wherein the quasi-intrinsic region, two first doped regions and insulated gate form a MOSFET device;

a second doped region of the second conductivity type in contact the quasi-intrinsic region but physically separated from each one of the two first doped regions;

wherein the second doped region is configured, in response to a bias applied between the insulated gate and the second doped region, to supply charge to the quasi-intrinsic region to operate the transistor as a bipolar transistor device.

16. The transistor of claim 15, wherein the two first doped regions forming source and drain terminals for the MOSFET and emitter and collector terminals for the bipolar transistor device.

17. The transistor of claim 15, wherein the quasi-intrinsic region forms a channel for the MOSFET and a base terminal for the bipolar transistor device.

18. The transistor of claim 15, arranged on an insulator layer of a semiconductor on insulator (SOI) structure.

19. The transistor of claim 18, wherein the insulator layer is arranged on a semiconductor substrate of the second conductivity type provided with a bias contact.

20. The transistor of claim 15, wherein the quasi-intrinsic region is strip-shaped including a pair of opposed sides each in contact with one of the two first doped regions, and wherein the second doped region is in contact with one of the opposed sides.

21. The transistor of claim 15, wherein the quasi-intrinsic region is strip-shaped including a pair of opposed sides each in contact with one of the two first doped regions, and wherein the second doped region is in contact with a further side of the quasi-intrinsic region.

22. The transistor of claim 15, wherein the quasi-intrinsic region has the shape of a fork comprising:

a handle;

two branches; and a connection between the handle and the two branches;

wherein a portion of the handle extends between the two first doped regions; and wherein the second doped region extends between the two branches with the second doped region being in contact with each of the two branches and with the connection.

* * * * *